US011456588B2

(12) United States Patent
Liebsch

(10) Patent No.: US 11,456,588 B2
(45) Date of Patent: Sep. 27, 2022

(54) PROTECTIVE CIRCUIT FOR A FIELD-EFFECT TRANSISTOR

(71) Applicant: GKN Automotive Ltd., Birmingham (GB)

(72) Inventor: Roman Liebsch, Rösrath (DE)

(73) Assignee: GKN Automotive Ltd., Birmingham (GB)

( * ) Notice: Subject to any disclaimer, the term of this patent is extended or adjusted under 35 U.S.C. 154(b) by 260 days.

(21) Appl. No.: 16/758,145

(22) PCT Filed: Oct. 23, 2017

(86) PCT No.: PCT/EP2017/076970
§ 371 (c)(1),
(2) Date: Apr. 22, 2020

(87) PCT Pub. No.: WO2019/080989
PCT Pub. Date: May 2, 2019

(65) Prior Publication Data

US 2020/0287371 A1 Sep. 10, 2020

(51) Int. Cl.
*H02H 3/08* (2006.01)
*B60R 16/02* (2006.01)
(Continued)

(52) U.S. Cl.
CPC ............. *H02H 3/085* (2013.01); *B60R 16/02* (2013.01); *G01R 31/006* (2013.01); *G01R 31/3277* (2013.01); *H02H 1/0007* (2013.01)

(58) Field of Classification Search
CPC ...... H02H 3/085; H02H 1/0007; B60R 16/02; G01R 31/006; G01R 31/3277
See application file for complete search history.

(56) References Cited

U.S. PATENT DOCUMENTS 5,719,519 A * 2/1998 Berringer ........... H03K 17/0828 327/488
5,959,464 A 9/1999 Qualich
(Continued)

FOREIGN PATENT DOCUMENTS

| | | | |
|---|---|---|---|
| CN | 103149407 | A | 6/2013 |
| DE | 102012109745 | A1 | 4/2013 |
| JP | 2008058134 | A | 3/2008 |

OTHER PUBLICATIONS

International Search Report and Written Opinion for PCT/EP2017/076970 dated Jul. 4, 2018 (11 pages; with English translation).
(Continued)

*Primary Examiner* — Scott Bauer
(74) *Attorney, Agent, or Firm* — Bejin Bieneman PLC

(57) ABSTRACT

A protective circuit includes a first field-effect transistor having a first drain terminal, a first source terminal and a first gate terminal, a control device by which an electrical first voltage between the first drain terminal and the first source terminal can be determined, and a first temperature sensor by which a first temperature of the first field-effect transistor can be detected, wherein a first resistance of the first field effect transistor and an electrical first current conducted via the first field-effect transistor can be determined by the control device based on the first temperature.

17 Claims, 1 Drawing Sheet

(51) Int. Cl.

| | |
|---|---|
| ***G01R 31/00*** | (2006.01) |
| ***G01R 31/327*** | (2006.01) |
| ***H02H 1/00*** | (2006.01) |

(56) References Cited

U.S. PATENT DOCUMENTS

| | | | | |
|---|---|---|---|---|
| 7,589,490 | B2 | 9/2009 | Haesters et al. | |
| 7,759,891 | B2 | 7/2010 | Serizawa et al. | |
| 9,263,877 | B1 * | 2/2016 | Kellogg .................. | G01K 7/22 |
| 2012/0326531 | A1 * | 12/2012 | Kawamoto ........... | H02J 7/0031<br>307/130 |
| 2013/0093411 | A1 | 4/2013 | Koeppl et al. | |

OTHER PUBLICATIONS

Chinese Office Action dated Aug. 25, 2021 for application No. CN 201780096209.4 (17 pages; with English translation).

Japanese Patent Office Notification of Reasons for Rejection for Application No. JP2020-542496 dated Jan. 12, 2021 (4 pages; with English translation).

* cited by examiner

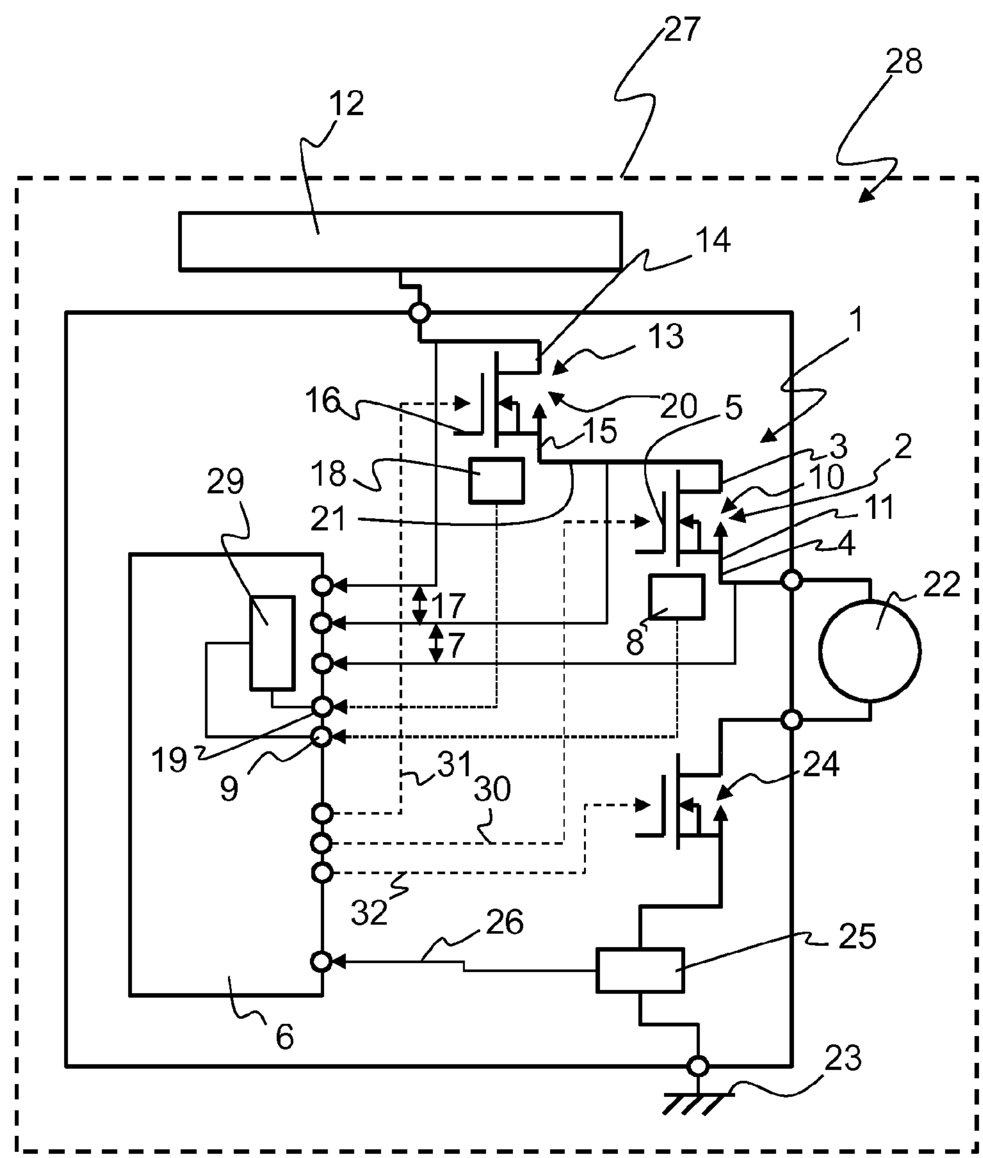
27
28
12
14
13
1
16
20
5
15
3
2
18
10
29
21
11
4
22
17
7
8
19
9
31
30
24
32
26
25
6
23

PROTECTIVE CIRCUIT FOR A FIELD-EFFECT TRANSISTOR

CROSS-REFERENCE TO RELATED APPLICATIONS

This application is a national stage of, and claims priority to, Patent Cooperation Treaty Application No. PCT/EP2017/076970, filed on Oct. 23, 2017, which application is hereby incorporated herein by reference in its entirety.

BACKGROUND

Some circuits having field-effect transistors (so-called FETs) for driving pumps, servomotors or other units are already known. U.S. Pat. No. 7,759,891 B2 discloses that temperature monitoring of a FET is provided in such a circuit. The temperature monitoring is intended to protect a motor driven via the FET against damage. It is assumed that a limit value of the temperature is exceeded, e.g., in the case of an electrical short circuit. Therefore, the temperature of the FET is compared with an ambient temperature and, as soon as the difference temperature thus determined exceeds the defined limit value, forwarding of current via the FET is turned off. A more differentiated evaluation of the cause of the limit value being reached is not possible in this case.

SUMMARY

The present disclosure relates to a protective circuit for a first field-effect transistor, wherein the protective circuit is used in a motor vehicle. A field-effect transistor comprises a source terminal, a drain terminal and also a gate terminal. An electrically conductive connection between the source terminal and the drain terminal can be switched on and off via the gate terminal.

The present disclosure provides a protective circuit which enables an accurate evaluation of the electrical currents conducted via a field-effect transistor. A protective circuit that is as cost-effective as possible is provided in this case.

A protective circuit comprises at least a first field-effect transistor, a control device, and a first temperature sensor. The first field-effect transistor has a first source terminal, a first drain terminal and a first gate terminal. An electrical first voltage [volts] between the first source terminal and the first drain terminal is determinable by the control device. A variable first temperature [degrees Celsius] of the first field-effect transistor is detectable by the first temperature sensor. A first (electrical) resistance [ohms] of the first field-effect transistor and (thus) an electrical first current (current intensity in [amperes]) conducted via the first field-effect transistor are determinable by the control device based on the first temperature.

It is proposed here, in particular, to determine the (present) first temperature of the first field-effect transistor via sensors and/or computationally. The first temperature is, however, in particular not compared with an ambient temperature. Here, in particular, exclusively the first temperature is determined and a first resistance of the first field-effect transistor that changes depending on the first temperature is thus deduced. Based on the first voltage drop across the first field-effect transistor and the first resistance, an electrical first current conducted via the first field-effect transistor is then determinable (in particular computationally).

In particular, for this purpose, a characteristic of the first field-effect transistor, that is to say a variation of the first electrical resistance as a function of a first temperature of the first field-effect transistor, is known and stored in the control device.

In particular, a relationship between the first temperature and the first resistance that is linear (at least approximately in the operating range) can be predefined here. This linear relationship is preferably present at least in a range of the first resistance in which the absolute value of the first resistance varies between 50% and 200% of an average value of the first resistance. The average value of the first resistance is present at a predefined reference temperature of the first temperature, e.g., at 20 degrees Celsius.

The first field-effect transistor can be connected to a voltage source via the first drain terminal, wherein a second field-effect transistor is arranged between the voltage source and the first field-effect transistor. The second field-effect transistor has a second source terminal, a second drain terminal and a second gate terminal. An electrical second voltage between the second source terminal and the second drain terminal is determinable by the control device. A variable second temperature of the second field-effect transistor can be detectable by the first temperature sensor and/or by a second temperature sensor. A second electrical resistance of the second field-effect transistor and (thus) an electrical second current conducted via the second field-effect transistor are determinable based on the second temperature (as described above for the first field-effect transistor).

The voltage source provides in particular a voltage of at most 100 volts, e.g. 12 volts, 24 volts or 48 volts.

The first source terminal can be connected to at least one electrical machine and to an electrical ground via the electrical machine.

A third field-effect transistor can be arranged between the electrical machine and the ground, wherein an electrical measuring resistor for determining an electrical third current conducted via the third field-effect transistor is arranged between the third field-effect transistor and the ground.

The measuring resistor (also referred to as shunt) is, in particular, a low-resistance electrical resistor that is used (if appropriate substantially only) for measuring the electrical current intensity. The current that flows through a shunt causes a voltage drop proportional to its intensity; the voltage drop is measured.

In particular, the measuring resistor is also electrically conductively connected to the control device, such that a current conducted via the third field-effect transistor can be monitored by the control device.

The arrangement of such a measuring resistor or of an additional measuring resistor in the circuit or protective circuit (that is to say in the region of the first and second field-effect transistors) is costly. It is thus proposed here, at least as a supplement to one measuring resistor (and/or as a replacement of the measuring resistor), to provide at least one temperature sensor for detecting a change in the resistance of a field-effect transistor, such that the electrical current conducted by the field-effect transistor can be deduced based on the change in the resistance.

The electrical machine can have a rated power [watts] of less than 10 kilowatts, in particular of less than 5 kilowatts, preferably of less than 1 kilowatt.

At least the first electrical current (and/or the second current) can be ascertainable with an accuracy of less than 2.0 amperes, in particular less than 1.5 amperes, preferably less than 1.0 ampere, based on the variable first temperature (and/or second temperature).

At least the first temperature sensor (and/or the second temperature sensor) can be connected to the control device via an analog-to-digital convertor. Via the analog-to-digital convertor, analog signals of a temperature sensor can be converted into digital signals. The conversion can be affected with a required resolution, such that an electrical current is determinable with a required or demanded accuracy.

A motor vehicle comprising an electrical machine and comprising a protective circuit described above is proposed, wherein the first source terminal of the first field-effect transistor is connected to at least the electrical machine and to an electrical ground via the electrical machine.

The explanations concerning the protective circuit can be enlisted individually and in combination with one another for elucidation for the motor vehicle, and vice versa.

Moreover, a method for operating and/or protecting an electrical circuit is proposed, wherein the electrical circuit includes at least one protective circuit described above. The method comprises at least the following steps:

a) determining an electrical first voltage between the first source terminal and the first drain terminal;
b) detecting a first temperature of the first field-effect transistor;
c) calculating an electrical first current conducted via the first field-effect transistor (via the control device).

The first source terminal can be connected to at least one electrical machine and to an electrical ground via the electrical machine, wherein a third field-effect transistor is arranged between the electrical machine and the electrical ground. A measuring resistor for determining an electrical third current conducted via the third field-effect transistor can be arranged between the third field-effect transistor and the electrical ground. In a process i) the third current can be determined, wherein in a process ii) the first current and the third current (and/or the second current) can be evaluated in the control device.

Via the evaluation of the individual electrical currents, a state of the protective circuit can be deduced. In particular, short circuits are thus identifiable and assessable. Based on the evaluation, a decision can be taken as to whether operation of the protective circuit can be continued, whether a warning message ought to be transmitted or whether operation of the protective circuit ought at least temporarily to be interrupted or continued in a restricted manner. In particular, limit values can be stored in the control device, such that specific measures can be initiated in the event of specific limit values being reached.

The explanations concerning the method can be enlisted individually and in combination with one another for elucidation for the protective circuit and/or the motor vehicle, and vice versa.

As a precaution it should be noted that the numerals used here ("first", "second", "third", . . . ) serve primarily (only) for distinguishing a plurality of objects, variables or processes of identical type, that is to say in particular do not necessarily stipulate a dependence and/or order of said objects, variables or processes with respect to one another. Should a dependence and/or order be required, this is explicitly specified here or it is evident in an obvious manner to the person skilled in the art upon studying the embodiment specifically described.

SUMMARY OF THE DRAWINGS

The disclosure and also the technical environment are explained in greater detail below with reference to the schematic FIGURE. It should be pointed out that the disclosure is not intended to be restricted by the exemplary embodiment shown. In particular, unless explicitly explained otherwise, it is also possible to extract partial aspects of the substantive matter elucidated in the FIGURE and to combine them with other constituent parts and insights from the present description.

FIG. 1 shows a schematic representation of a motor vehicle having a protective circuit.

DETAILED DESCRIPTION

FIG. 1 shows a motor vehicle 27 comprising an electrical circuit 28, which includes a protective circuit 1. The electrical circuit 28 includes a voltage source 12, an electrical machine 22 and a ground 23. A control device 6 regulates and monitors the operation of the electrical machine 22 by way of the circuit 28. The protective circuit 1 for the first field-effect transistor 2 includes the first field-effect transistor 2, a control device 6 and also a first temperature sensor 8. The first field-effect transistor 2 has a first drain terminal 3, a first source terminal 4 and a first gate terminal 5. An electrical first voltage 7 between the first drain terminal 3 and the first source terminal 4 is determinable by the control device 6. A variable first temperature 9 of the first field-effect transistor 2 is detectable by the first temperature sensor 8. A first resistance 10 of the first field-effect transistor 2 and thus an electrical first current 11 conducted via the first field-effect transistor 2 are determinable by the control device 6 based on the first temperature 9.

Here, exclusively the first temperature 9 is determined and a first resistance 10 of the first field-effect transistor 2 that changes depending on the first temperature 9 is thus deduced. Based on the first voltage 7 drop across the first field-effect transistor 2 and the first resistance 10, an electrical first current 11 conducted via the first field-effect transistor 2 is determinable.

The first field-effect transistor 2 is connected to the voltage source 12 via the first drain terminal 3, wherein a second field-effect transistor 13 is arranged between the voltage source 12 and the first field-effect transistor 2. The second field-effect transistor 13 has a second drain terminal 14, a second source terminal 15 and a second gate terminal 16. An electrical second voltage 17 between the second drain terminal 14 and the second source terminal 15 is determinable by the control device 6. A variable second temperature 19 of the second field-effect transistor 13 is detectable by a second temperature sensor 18. A second resistance 20 of the second field-effect transistor 13 and thus an electrical second current 21 conducted via the second field-effect transistor 13 are determinable based on the second temperature 19.

A third field-effect transistor 24 is arranged between the electrical machine 22 and the ground 23, wherein a measuring resistor 25 for determining an electrical third current 26 conducted via the third field-effect transistor 24 is arranged between the third field-effect transistor 24 and the ground 23.

The measuring resistor 25 is connected to the control device 6, such that a third current 26 conducted via the third field-effect transistor 24 can be monitored by the control device 6.

The first temperature sensor 8 and the second temperature sensor 18 are connected to the control device 6 via an analog-to-digital convertor 29. Via the analog-to-digital convertor 29, analog signals of the temperature sensors 8, 18 can be converted into digital signals. The conversion can be affected with a required resolution, such that an electrical current 11, 21 is determinable with a required or demanded accuracy. Via the analog-to-digital convertor 29, the electrical voltages 7, 17 can also be detected and, in particular, converted into digital signals.

Via the evaluation of the individual electrical currents 11, 21, 26, a state of the protective circuit 1 and/or of the circuit 28 can be deduced. In particular, short circuits are thus identifiable and assessable. Based on the evaluation, a decision can be taken as to whether operation of the protective circuit 1 and/or of the circuit 28 can be continued, whether a warning message ought to be transmitted or whether operation of the protective circuit 1/circuit 28 ought at least temporarily to be interrupted or continued in a restricted manner. In particular, limit values for currents 11, 21, 26 and/or limit values for ratios of currents 11, 21, 26 etc. can be stored in the control device 6, such that specific measures can be initiated upon specific limit values being reached. Via the control device 6, control signals 30, 31, 32 can be communicated to the gate terminals 5, 16 of the field-effect transistors 2, 13, 24 and corresponding switching of the field-effect transistors 2, 13, 24 can be performed.

LIST OF REFERENCE SIGNS

1 Protective circuit
2 First field-effect transistor
3 First drain terminal
4 First source terminal
5 First gate terminal
6 Control device
7 First voltage
8 First temperature sensor
9 First temperature
10 First resistance
11 First current
12 Voltage source
13 Second field-effect transistor
14 Second drain terminal
15 Second source terminal
16 Second gate terminal
17 Second voltage
18 Second temperature sensor
19 Second temperature
20 Second resistance
21 Second current
22 Electrical machine
23 Ground
24 Third field-effect transistor
25 Measuring resistor
26 Third current
27 Motor vehicle
28 Circuit
29 Analog-to-digital convertor
30 First control signal
31 Second control signal
32 Third control signal

The invention claimed is:

1. A protective circuit comprising:

a first field-effect transistor having a first drain terminal, a first source terminal and a first gate terminal, wherein the first source terminal is connected to at least one electrical machine and to an electrical ground via the electrical machine;

a control device by which an electrical first voltage between the first drain terminal and the first source terminal is determinable, a first temperature sensor by which a first temperature of the first field-effect transistor is detectable;

a third field-effect transistor arranged between the electrical machine and the electrical ground; and a measuring resistor arranged between the third field-effect transistor and the electrical ground;

wherein a first resistance of the first field-effect transistor and an electrical first current conducted via the first field-effect transistor are determinable by the control device based on the first temperature;

an electrical third current conducted via the third field-effect transistor is determinable by the control device via the measuring resistor; and a limit value for a ratio of the electrical first current and electrical third current is stored in the control device, such that specific measures are initiated and control signals are communicated to the gate terminals of the field-effect transistors upon the limit value being reached.

2. The protective circuit of claim 1, wherein the first field-effect transistor is connected to a voltage source via the first drain terminal.

3. The protective circuit of claim 2, further comprising:

a second field-effect transistor arranged between the voltage source and the first field-effect transistor;

the second field-effect transistor having a second drain terminal, a second source terminal and a second gate terminal;

wherein an electrical second voltage between the second drain terminal and the second source terminal is determinable by the control device.

4. The protective circuit of claim 3, wherein a second temperature of the second field-effect transistor is detectable by one of the first temperature sensor or a second temperature sensor, and wherein a second resistance of the second field-effect transistor and an electrical second current conducted via the second field-effect transistor are determinable based on the second temperature.

5. The protective circuit of claim 1, wherein the electrical machine has a rated power of less than ten kilowatts.

6. The protective circuit of claim 1, wherein at least the first current is ascertainable with an accuracy of less than 2.0 amperes based on the first temperature.

7. The protective circuit of claim 1, wherein at least the first temperature sensor is connected to the control device via an analog-to-digital convertor.

8. A motor vehicle comprising an electrical machine and a protective circuit, the protective circuit including:

a first field-effect transistor having a first drain terminal, a first source terminal and a first gate terminal;

a control device by which an electrical first voltage between the first drain terminal and the first source terminal is determinable;

a first temperature sensor by which a first temperature of the first field-effect transistor is detectable;

a third field-effect transistor arranged between the electrical machine and an electrical ground; and a measuring resistor arranged between the third field-effect transistor and the electrical ground;

wherein a first resistance of the first field-effect transistor and an electrical first current conducted via the first field-effect transistor are determinable by the control device based on the first temperature;

wherein the first drain terminal of the first field-effect transistor is connected to the electrical machine and to the electrical ground via the electrical machine wherein an electrical third current conducted via the third field-effect transistor is determinable by the control device via the measuring resistor; and wherein a limit value for a ratio of the electrical first current and electrical third current is stored in the control device, such that specific measures are initiated and control signals are communicated to the gate terminals of the field-effect transistors upon the limit value being reached.

9. The motor vehicle of claim 8, wherein the first field-effect transistor is connected to a voltage source via the first drain terminal.

10. The motor vehicle of claim 9, further comprising:

a second field-effect transistor arranged between the voltage source and the first field-effect transistor;

the second field-effect transistor having a second drain terminal, a second source terminal and a second gate terminal;

wherein an electrical second voltage between the second drain terminal and the second source terminal is determinable by the control device.

11. The motor vehicle of claim 10, wherein a second temperature of the second field-effect transistor is detectable by one of the first temperature sensor or a second temperature sensor, and wherein a second resistance of the second field-effect transistor and an electrical second current conducted via the second field-effect transistor are determinable based on the second temperature.

12. The motor vehicle of claim 8, wherein at least the first current is ascertainable with an accuracy of less than 2.0 amperes based on the first temperature.

13. A method for operating an electrical circuit comprising at least one protective circuit including a first field-effect transistor having a first drain terminal, a first source terminal and a first gate terminal, wherein the first source terminal is connected to at least one electrical machine and to an electrical ground via the electrical machine; a control device by which an electrical first voltage between the first drain terminal and the first source terminal is determinable; a first temperature sensor by which a first temperature of the first field-effect transistor is detectable; a third field-effect transistor arranged between the electrical machine and the electrical ground; and a measuring resistor arranged between the third field-effect transistor and the electrical ground; the method comprising:

determining an electrical first voltage between the first drain terminal and the first source terminal;

detecting a first temperature of the first field-effect transistor, wherein a first resistance of the first field-effect transistor and an electrical first current conducted via the first field-effect transistor are determinable by the control device based on the first temperature;

calculating an electrical first current conducted via the first field-effect transistor based on the detected first temperature;

determining, by the control device via the measuring resistor, an electrical third current conducted via the third field-effect transistor; and initiating specific measures and communicating control signals to the gate terminals of the field-effect transistors upon a limit value being reached, wherein the limit value is for a ratio of the electrical first current and electrical third current and is stored in the control device.

14. The method of claim 13, further comprising determining a state of the protective circuit based on the first current.

15. The method of claim 14, further comprising, based on the determined state, one of (a) continuing operation of the protective circuit, or (b) interrupting operation of the protective circuit.

16. The method of claim 14, wherein a second field-effect transistor is arranged between a voltage source and the first field-effect transistor; the second field-effect transistor has a second drain terminal, a second source terminal and a second gate terminal; the method further comprising:

determining an electrical second voltage between the second drain terminal and the second source terminal;

detecting a second temperature of the second field-effect transistor;

determining a second resistance of the second field-effect transistor and an electrical second current conducted via the second field-effect transistor based on the second temperature; and determining the state of the protective circuit additionally based on the second current.

17. The method of claim 16, further comprising:

determining the state of the protective circuit additionally based on the third current.

* * * * *